(12) United States Patent
Kosugi

(10) Patent No.: US 8,509,057 B2
(45) Date of Patent: Aug. 13, 2013

(54) COMMUNICATION SYSTEM, TEST APPARATUS, COMMUNICATION APPARATUS, COMMUNICATION METHOD AND TEST METHOD

(75) Inventor: Masaaki Kosugi, Gunma (JP)

(73) Assignee: Advantest Corporation, Tokyo (JP)

( * ) Notice: Subject to any disclaimer, the term of this patent is extended or adjusted under 35 U.S.C. 154(b) by 323 days.

(21) Appl. No.: 12/942,917

(22) Filed: Nov. 9, 2010

(65) Prior Publication Data

US 2011/0085608 A1 Apr. 14, 2011

Related U.S. Application Data

(63) Continuation of application No. PCT/JP2008/065458, filed on Aug. 28, 2008.

(60) Provisional application No. 61/057,205, filed on May 30, 2008.

(51) Int. Cl.
*H04L 12/26* (2006.01)

(52) U.S. Cl.
USPC .......................................................... 370/216

(58) Field of Classification Search
None
See application file for complete search history.

(56) References Cited

U.S. PATENT DOCUMENTS

| 7,340,364 | B1 | 3/2008 | Kumaki | |
|---|---|---|---|---|
| 2002/0035659 | A1* | 3/2002 | Kelly | 710/317 |
| 2003/0088318 | A1* | 5/2003 | Edogawa et al. | 700/1 |
| 2003/0219253 | A1* | 11/2003 | Kukshya et al. | 398/118 |
| 2004/0267999 | A1 | 12/2004 | Larson et al. | |
| 2006/0134479 | A1* | 6/2006 | Hu et al. | 429/22 |
| 2006/0246931 | A1 | 11/2006 | Kim | |
| 2008/0091377 | A1 | 4/2008 | Kumaki | |
| 2008/0164987 | A1* | 7/2008 | Bauerle et al. | 340/439 |
| 2009/0206841 | A1* | 8/2009 | Weng | 324/426 |

FOREIGN PATENT DOCUMENTS

| JP | 3-136537 A | 6/1991 |
|---|---|---|
| JP | 4-98443 A | 3/1992 |
| JP | 2005-4746 A | 1/2005 |
| KR | 10-2000-0041926 A | 7/2000 |
| KR | 10-2006-0114270 A | 11/2006 |
| WO | 2008/044421 A1 | 4/2008 |

OTHER PUBLICATIONS

Korean Office Action dated May 3, 2012, in a counterpart Korean patent application No. 10-2010-7025298.

(Continued)

*Primary Examiner* — Chirag Shah
*Assistant Examiner* — Amar Persaud

(57) ABSTRACT

A communication system comprising a first communication apparatus and a second communication apparatus. The first communication apparatus includes a communicating section that communicates with the second communication apparatus via a first data signal line; an alive signal receiving section that receives, via a first alive signal line, an alive signal indicating whether the second communication apparatus is in an alive state in which it is capable of communicating with the first communication apparatus; and a reset signal transmitting section that, when the second communication apparatus is not in the alive state, transmits a reset signal to the second communication apparatus. The second communication apparatus includes a communicating section that communicates with the first communication apparatus via the first data signal line; an alive signal transmitting section that transmits the alive signal via the first alive signal line; and a reset signal receiving section that, upon receiving a reset signal, resets the communicating section of the second communication apparatus.

10 Claims, 7 Drawing Sheets

(56) References Cited

OTHER PUBLICATIONS

International Search Report (ISR) issued in PCT/JP2008/065458 (parent application) mailed in Nov. 2008.
Written Opinion (PCT/ISA/237) issued in PCT/JP2008/065458 (parent application) mailed in Nov. 2008.
Applicants bring the attention of the Examiner to the following pending U.S. Appl. No. 12/942,912, filed Nov. 9, 2010 and U.S. Appl. No. 12/943,815, filed Nov. 10, 2010.
International Search Report (ISR) issued in PCT/JP2008/065456 (related application) mailed in Nov. 2008.
Written Opinion (PCT/ISA/237) issued in PCT/JP2008/065456 (related application) mailed in Nov. 2008.
International Search Report (ISR) issued in PCT/JP2008/062864 (related application) mailed in Oct. 2008.
Written Opinion (PCT/ISA/237) issued in PCT/JP2008/062864 (related application) mailed in Oct. 2008.

* cited by examiner

COMMUNICATION SYSTEM, TEST APPARATUS, COMMUNICATION APPARATUS, COMMUNICATION METHOD AND TEST METHOD

BACKGROUND

1. Technical Field

The present invention relates to a communication system, a test apparatus, a communication apparatus, a communication method, and a test method.

2. Related Art

In a communication system for serial communication between a master device and a slave device, data communication is performed after packets are synchronized. Furthermore, when a communication error occurs in such a communication system, the slave apparatus is reset and the packet synchronization is reacquired.

In a communication system that performs serial communication via an optical communication medium, it is possible to detect whether a communication partner is active based on whether light can be received from the communication partner. However, in a communication system that performs serial communication via an electric communication medium, it is difficult to detect whether the communication partner is active.

Furthermore, in a communication system that performs serial communication via an optical communication medium, the slave device can be easily reset by the master device turning the light on or off. However, in a communication system that performs serial communication via an electric communication medium, the master device cannot easily reset the slave device.

SUMMARY

Therefore, it is an object of an aspect of the innovations herein to provide a communication system, a test apparatus, a communication apparatus, a communication method, and a test method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, provided is a communication system comprising a first communication apparatus and a second communication apparatus. The first communication apparatus includes a communicating section that communicates with the second communication apparatus via a first data signal line; an alive signal receiving section that receives, via a first alive signal line, an alive signal indicating whether the second communication apparatus is in an alive state in which it is capable of communicating with the first communication apparatus; and a reset signal transmitting section that, when the second communication apparatus is not in the alive state, transmits a reset signal to the second communication apparatus. The second communication apparatus includes a communicating section that communicates with the first communication apparatus via the first data signal line; an alive signal transmitting section that transmits the alive signal via the first alive signal line; and a reset signal receiving section that, upon receiving a reset signal, resets the communicating section of the second communication apparatus.

According to a second aspect related to the innovations herein, provided is a test apparatus that tests a device under test, comprising a test module that tests the device under test; a control apparatus that controls testing of the device under test by the test module; and a relay apparatus that relays communication between the control apparatus and the test module. The control apparatus includes a communicating section that communicates with the relay apparatus via a first data signal line; an alive signal receiving section that receives, via a first alive signal line, an alive signal indicating whether the relay apparatus is in an alive state in which it is capable of communicating with the control apparatus; and a reset signal transmitting section that, when the relay apparatus is not in the alive state, transmits a reset signal to the relay apparatus. The relay apparatus includes a communicating section that communicates with the control apparatus via the first data signal line; an alive signal transmitting section that transmits the alive signal via the first alive signal line; and a reset signal receiving section that, upon receiving a reset signal, resets the communicating section of the relay apparatus.

According to a third aspect related to the innovations herein, provided is a communication apparatus that communicates with an other communication apparatus, comprising a communicating section that communicates with the other communication apparatus via a first data signal line; an alive signal receiving section that receives, via a first alive signal line, an alive signal indicating whether the other communication apparatus is in an alive state in which it is capable of communicating with the communication apparatus; and a reset signal transmitting section that, when the other communication apparatus is not in the alive state, transmits a reset signal to the other communication apparatus.

According to a fourth aspect related to the innovations herein, provided is a communication apparatus that communicates with an other communication apparatus, comprising a communicating section that communicates with the other communication apparatus via a first data signal line; an alive signal transmitting section that transmits an alive signal via a first alive signal line; and a reset signal receiving section that, upon receiving a reset signal, resets the communicating section of the communication apparatus.

According to a fifth aspect related to the innovations herein, provided is a communication method used by a communication system including a first communication apparatus and a second communication apparatus. In the communication method, a communicating section of the first communication apparatus and a communicating section of the second communication apparatus communicate via a first data signal line; an alive signal transmitting section of the second communication apparatus transmits, via a first alive signal line, an alive signal indicating whether the second communication apparatus is in an alive state in which it is capable of communicating with the first communication apparatus; an alive signal receiving section of the first communication apparatus receives the alive signal via the first alive signal line; when the second communication apparatus is not in the alive state, a reset signal transmitting section of the first communication apparatus transmits a reset signal to the second communication apparatus; and when the reset signal is received, a reset signal receiving section of the second communication apparatus resets the communicating section of the second communication apparatus.

According to a sixth aspect related to the innovations herein, provided is a test method used by a test apparatus to test a device under test. The test apparatus includes a test module that tests the device under test; a control apparatus that controls testing of the device under test by the test module; and a relay apparatus that relays communication between the control apparatus and the test module. In the test method, a communicating section of the control apparatus and a communicating section of the relay apparatus communicate via a first data signal line; an alive signal transmitting section of the relay apparatus transmits, via a first alive signal line, an alive signal indicating whether the relay apparatus is in an alive state in which it is capable of communicating with the control apparatus; an alive signal receiving section of the control apparatus receives the alive signal via the first alive signal line; when the relay apparatus is not in the alive state, a reset signal transmitting section of the control apparatus transmits a reset signal to the relay apparatus; and when the reset signal is received, a reset signal receiving section of the relay apparatus resets the communicating section of the relay apparatus.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 2 shows a process performed when power supply to the second communication apparatus 20 is turned ON.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
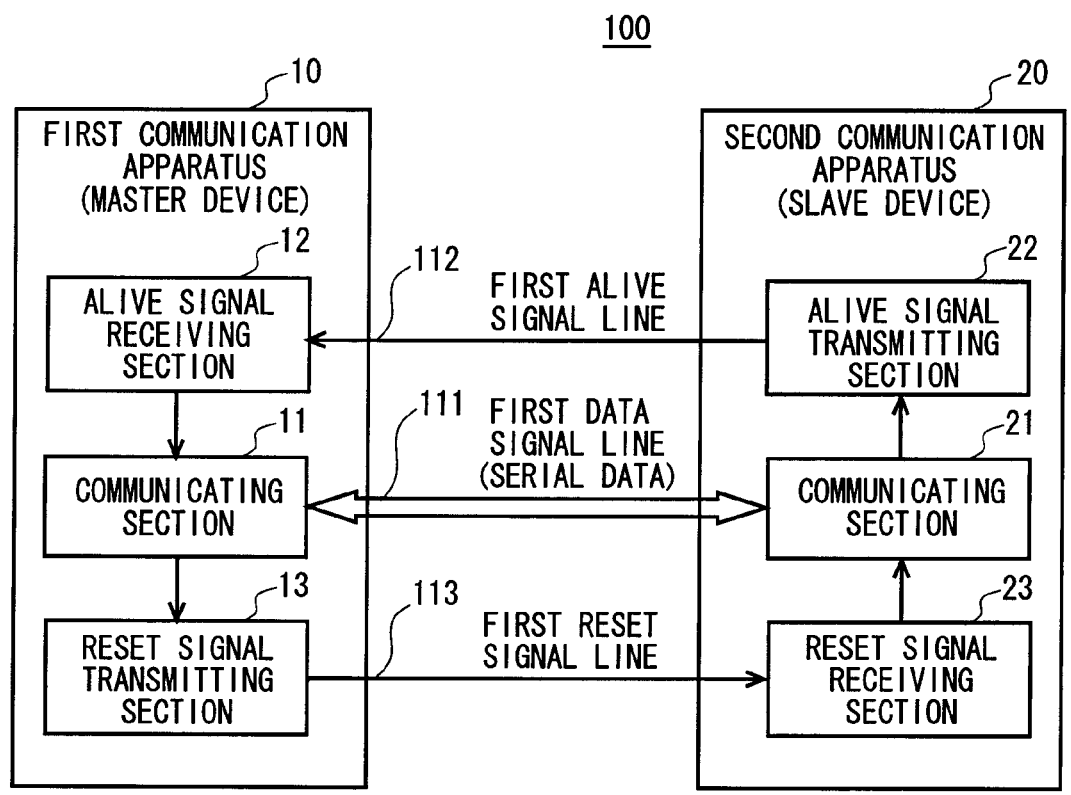
FIG. 1 shows an exemplary communication system 100 according to an embodiment of the present invention.

FIG. 1 shows an exemplary communication system 100 according to an embodiment of the present invention. The communication system 100 includes a first communication apparatus 10 and a second communication apparatus 20. In the present example, the first communication apparatus 10 and the second communication apparatus 20 perform data communication, the first communication apparatus 10 functions as a master device in the data communication, and the second communication apparatus 20 functions as a slave device in the data communication.

The first communication apparatus 10 is connected to the second communication apparatus 20 via a first data signal line 111, a first alive signal line 112, and a first reset signal line 113. The first data signal line 111 transmits serial data of electric signals exchanged between the first communication apparatus 10 and the second communication apparatus 20.

The first alive signal line 112 transmits, from the second communication apparatus 20 to the first communication apparatus 10, an alive signal indicating whether the second communication apparatus 20 is in an alive state in which it is capable of communicating with the first communication apparatus 10. In the present example, the first alive signal line 112 transmits an alive signal that uses a voltage level to indicate whether the second communication apparatus 20 is in the alive state.

The first reset signal line 113 transmits, from the first communication apparatus 10 to the second communication apparatus 20, a reset signal ordering a reset for the second communication apparatus 20. In the present example, the first reset signal line 113 transmits a reset signal that uses a voltage level indicating whether a reset is ordered for the second communication apparatus 20.

The first communication apparatus 10 includes a communicating section 11, an alive signal receiving section 12, and a reset signal transmitting section 13. The second communication apparatus 20 includes a communicating section 21, an alive signal transmitting section 22, and a reset signal receiving section 23.

The communicating section 11 of the first communication apparatus 10 communicates with the second communication apparatus 20 via the first data signal line 111. The alive signal receiving section 12 of the first communication apparatus 10 receives the alive signal from the second communication apparatus 20 via the first alive signal line 112. When receiving an alive signal expressed as a voltage level, the alive signal receiving section 12 of the first communication apparatus 10 may judge whether the second communication apparatus 20 is in the alive state on a condition that the alive signal maintains a prescribed level for a prescribed period, such as a prescribed number of samples, or longer. When the second communication apparatus 20 is not in the alive state, the reset signal transmitting section 13 of the first communication apparatus 10 transmits a reset signal to the second communication apparatus 20 via the first reset signal line 113.

The communicating section 21 of the second communication apparatus 20 communicates with the first communication apparatus 10 via the first data signal line 111. When the communicating section 21 of the second communication apparatus 20 is in an alive state in which it is capable of communicating with the first communication apparatus 10, the alive signal transmitting section 22 of the second communication apparatus 20 transmits the alive signal to the first communication apparatus 10 via the first alive signal line 112.

The reset signal receiving section 23 of the second communication apparatus 20 receives the reset signal from the first communication apparatus 10 via the first reset signal line 113. When the reset signal is received, the reset signal receiving section 23 of the second communication apparatus 20 resets the communicating section 21 of the second communication apparatus 20. When a reset signal expressed as a voltage level is received, the reset signal receiving section 23 of the second communication apparatus 20 may judge that the first communication apparatus 10 has output a reset signal on a condition that the reset signal maintains a prescribed level for a prescribed period, such as a prescribed number of samples, or longer.

The first data signal line 111 preferably has a lower attenuation rate than the first alive signal line 112 and the first reset signal line 113 at the cycle frequency of the data signal. In other words, the first data signal line 111 may be a cable capable of transmitting a higher-frequency electric signal than the first alive signal line 112 and the first reset signal line 113. As a result, the communication system 100 can use cables that are less expensive than the first data signal line 111 as the first alive signal line 112 and the first reset signal line 113.

Figure 2:
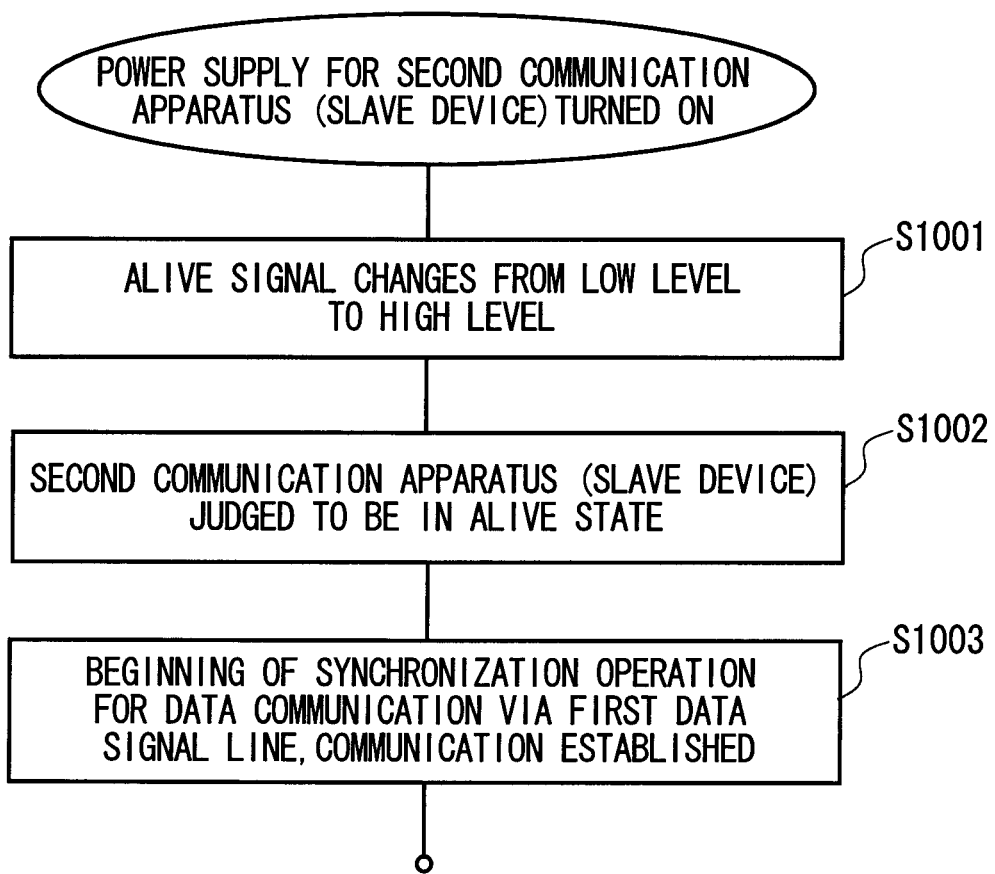

FIG. 2 shows a process performed when power supply to the second communication apparatus 20 is turned ON. When the power supply to the second communication apparatus 20, which is the slave device, is turned ON, the communicating section 21 of the second communication apparatus 20 enters the alive state. When the communicating section 21 of the second communication apparatus 20 enters the alive state, the alive signal transmitting section 22 of the second communication apparatus 20 changes the alive signal from low level to high level (S1001).

Next, upon detecting that the alive signal has changed from low level to high level, the alive signal receiving section 12 of the first communication apparatus 10, which is the master device, judges that the second communication apparatus 20 is in the alive state (S1002). The communicating section 11 of the first communication apparatus 10 then begins the synchronizing operation for data communication with the second communication apparatus 20 via the first data signal line 111 (S1003). In this way, the first communication apparatus 10 and the second communication apparatus 20 can establish data communication via the first data signal line 111. In the manner described above, the communication system 100 enables the first communication apparatus 10 to easily detect activation of the second communication apparatus 20.

Figure 3:
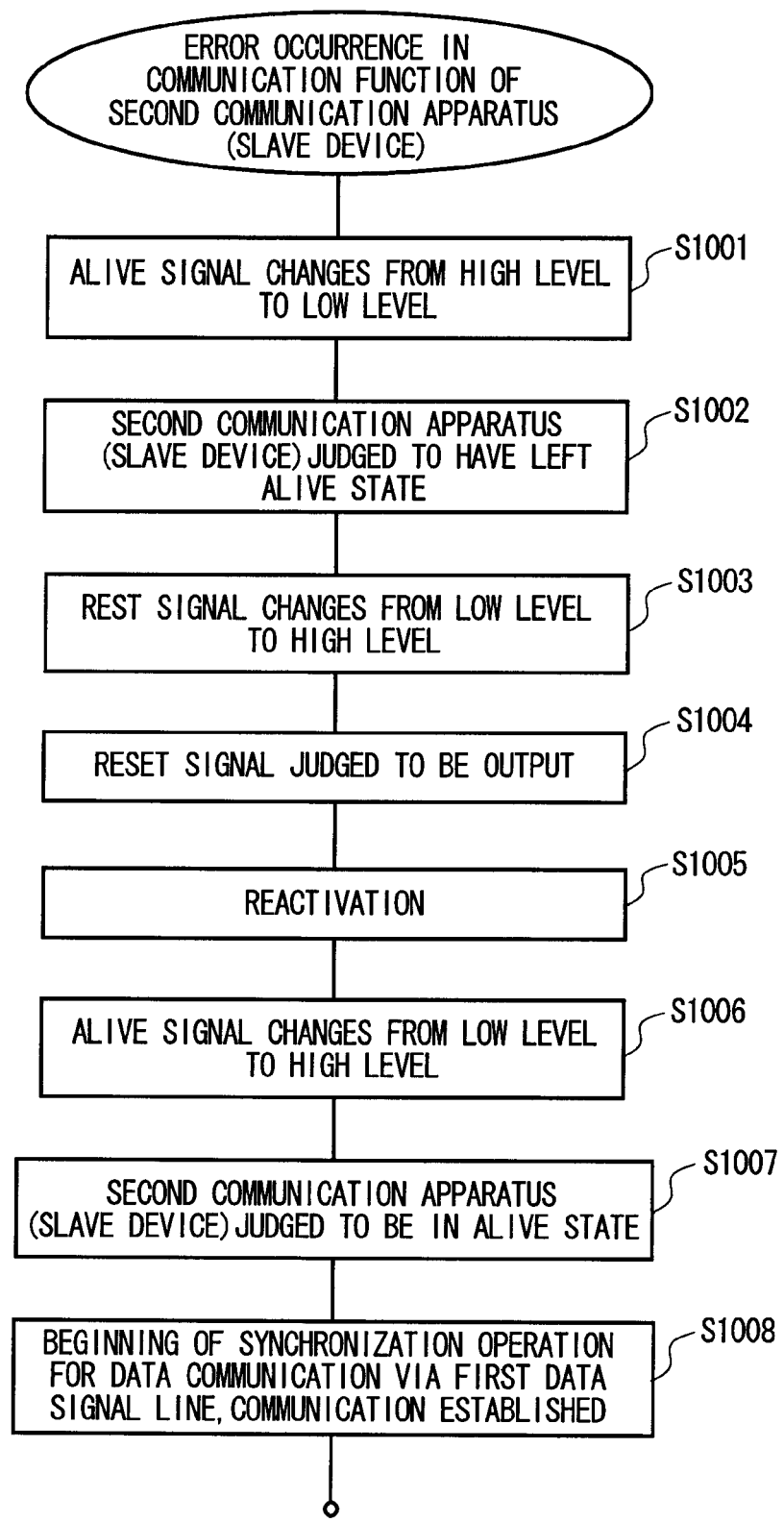
FIG. 3 shows a process performed when an error occurs in the communication function of the second communication apparatus 20.

FIG. 3 shows a process performed when an error occurs in the communication function of the second communication apparatus 20. When an error occurs in the communication function of the second communication apparatus 20, such as when a hang up or the like occurs in the serial communication by the second communication apparatus 20, the communicating section 21 of the second communication apparatus 20 leaves the alive state. When the communicating section 21 of the second communication apparatus 20 leaves the alive state, the alive signal transmitting section 22 of the second communication apparatus 20 changes the alive signal from high level to low level (S1101).

Next, upon detecting that the alive signal has changed from high level to low level, the alive signal receiving section 12 of the first communication apparatus 10, which is the master device, judges that the second communication apparatus 20 has left the alive state (S1102). The reset signal transmitting section 13 of the first communication apparatus 10 then changes the reset signal from low level to high level (S1103). For example, the reset signal transmitting section 13 of the first communication apparatus 10 may change the reset signal to high level and, after a prescribed time has passed, return the reset signal to low level.

Next, upon detecting that the reset signal has changed from low level to high level, the reset signal receiving section 23 of the second communication apparatus 20 judges that the reset signal has been output from the first communication apparatus 10 (S1104). The communicating section 21 of the second communication apparatus 20 then initializes each function for performing data communication with the first communication apparatus 10 via the first data signal line 111, and reactivates the communication function (S1105). As a result, the communicating section 21 of the second communication apparatus 20 enters the alive state. When the communicating section 21 of the second communication apparatus 20 enters the alive state, the alive signal transmitting section 22 of the second communication apparatus 20 changes the alive signal from low level to high level (S1106).

Next, upon detecting that the alive signal has changed from low level to high level, the alive signal receiving section 12 of the first communication apparatus 10 judges that the second communication apparatus 20 has entered the alive state (S1107). The communicating section 11 of the first communication apparatus 10 then begins the synchronizing operation for data communication with the second communication apparatus 20 via the first data signal line 111 (S1108). In this way, even when an error occurs in the data communication between the first communication apparatus 10 and the second communication apparatus 20 via the first data signal line 111, the first communication apparatus 10, which is the master device, can easily reset the second communication apparatus 20, which is the slave device.

At step S1103, the reset signal transmitting section 13 of the first communication apparatus 10 changes the reset signal from low level to high level to provide the second communication apparatus 20 with a reset instruction, but the second communication apparatus 20 may be reset using another method. Furthermore, when a packet jam or the like occurs in the transmission from the first communication apparatus 10 to the second communication apparatus 20 via the first data signal line 111, the first communication apparatus 10 may reset the communication function of the second communication apparatus 20 even if the second communication apparatus 20 is in the alive state.

When the second communication apparatus 20 is in the alive state, the communicating section 11 of the first communication apparatus 10 may transmit a reset request to the second communication apparatus 20 via the first data signal line 111 as necessary. For example, when the second communication apparatus 20 is in the alive state, the communicating section 11 of the first communication apparatus 10 may transmit to the second communication apparatus 20, via the first data signal line 111, a reset request ordering the reset of at least a portion of the circuits of the second communication apparatus 20. For example, the communicating section 11 of the first communication apparatus 10 may transmit to the second communication apparatus 20, via the first data signal line 111, a reset request that includes circuit identification information identifying circuits to be reset.

When a reset request is transmitted via the first data signal line 111 in this way, the communicating section 21 of the second communication apparatus 20 resets the circuits corresponding to the circuit identification information included in the reset request received via the first data signal line 111. For example, the communicating section 21 of the second communication apparatus 20 may reset the circuits corresponding to the circuit identification information included in the reset received via the first data signal line 111. As a result, the first communication apparatus 10 can transmit a normal reset request to the second communication apparatus 20 via the first data signal line 111 and transmit an emergency reset request to the second communication apparatus 20 via the first reset signal line 113.

Figure 4:
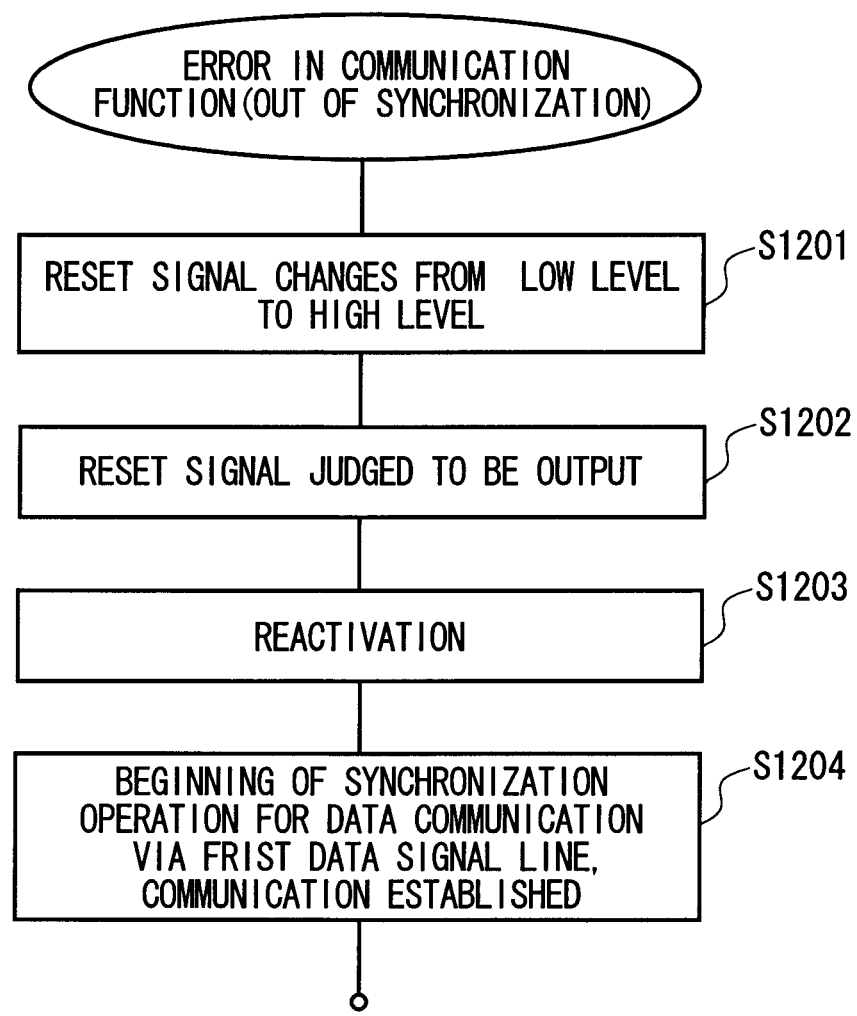
FIG. 4 shows a process performed when an error occurs in the communication function of the first communication apparatus 10.

FIG. 4 shows a process performed when an error occurs in the communication function of the first communication apparatus 10. When an error occurs in the communication function of the first communication apparatus 10, i.e. the master device, such as when packet synchronization cannot be achieved in the serial transmission by the first communication apparatus 10, the reset signal transmitting section 13 of the first communication apparatus 10 changes the reset signal from low level to high level (S1201).

Next, upon detecting that the reset signal has changed from low level to high level, the reset signal receiving section 23 of the second communication apparatus 20 judges that a reset instruction has been supplied from the first communication apparatus 10 (S1202). The communicating section 21 of the second communication apparatus 20 then initializes each function for performing data communication with the first communication apparatus 10 via the first data signal line 111, and reactivates the communication function (S1203).

Next, the communicating section 21 of the second communication apparatus 20 begins the synchronizing operation for data communication with the first communication apparatus 10 via the first data signal line 111 (S1204). In this way, even when an error occurs in the data communication between the first communication apparatus 10 and the second communication apparatus 20 via the first data signal line 111, the first communication apparatus 10, which is the master apparatus, can easily reset the second communication apparatus 20, which is the slave apparatus.

Figure 5:
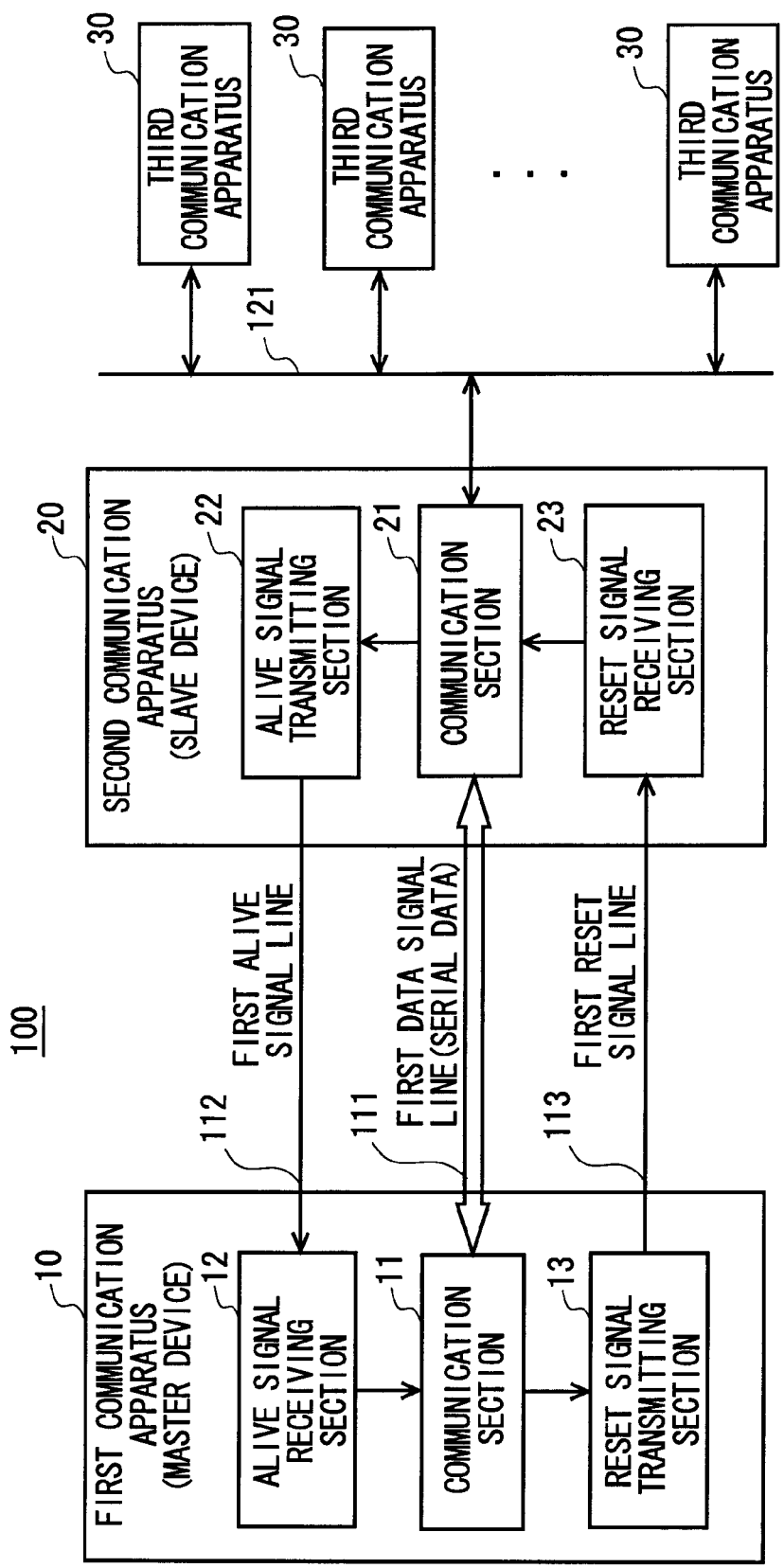
FIG. 5 shows a configuration of a communication system 100 according to a first modification of the present embodiment.

FIG. 5 shows a configuration of a communication system 100 according to a first modification of the present embodiment. The communication system 100 of the present modification adopts the same function and configuration as the communication system 100 shown in FIG. 1, and therefore components having the same function and configuration as those of the communication system 100 shown in FIG. 1 are given the same reference numerals and the following description includes only differing points.

The communication system 100 of the present modification further includes a plurality of third communication apparatuses 30. Each third communication apparatus 30 performs data communication with the second communication apparatus 20. A second data signal line 121 provides connections between the third communication apparatuses 30 and the second communication apparatus 20. The second data signal line 121 transmits data of electric signals exchanged between the second communication apparatus 20 and the third communication apparatuses 30.

When a reset signal is received, the reset signal receiving section 23 of the second communication apparatus 20 resets the communicating section 21 of the second communication apparatus 20. Upon entering the alive state, the communicating section 21 of the second communication apparatus 20 resets each of the third communication apparatuses 30. As a result, the even when there is cause for a communication error in one of the third communication apparatuses 30, the communication system 100 of the present modification can reliably restore data communication between the first communication apparatus 10 and the second communication apparatus 20.

When the second communication apparatus 20 is in the alive state, the communicating section 11 of the first communication apparatus 10 may transmit to the second communication apparatus 20, via the first data signal line 111, a reset request including apparatus identification information for identifying third communication apparatuses 30 to be reset from among the plurality of third communication apparatuses 30. Upon receiving such a reset request, the communicating section 21 of the second communication apparatus 20 resets the third communication apparatuses 30 corresponding to the apparatus identification information included in the reset request received via the first data signal line 111. As a result, the communication system 100 of the present embodiment can reset only the portion of the third communication apparatuses 30 that cause a communication error.

Figure 6:
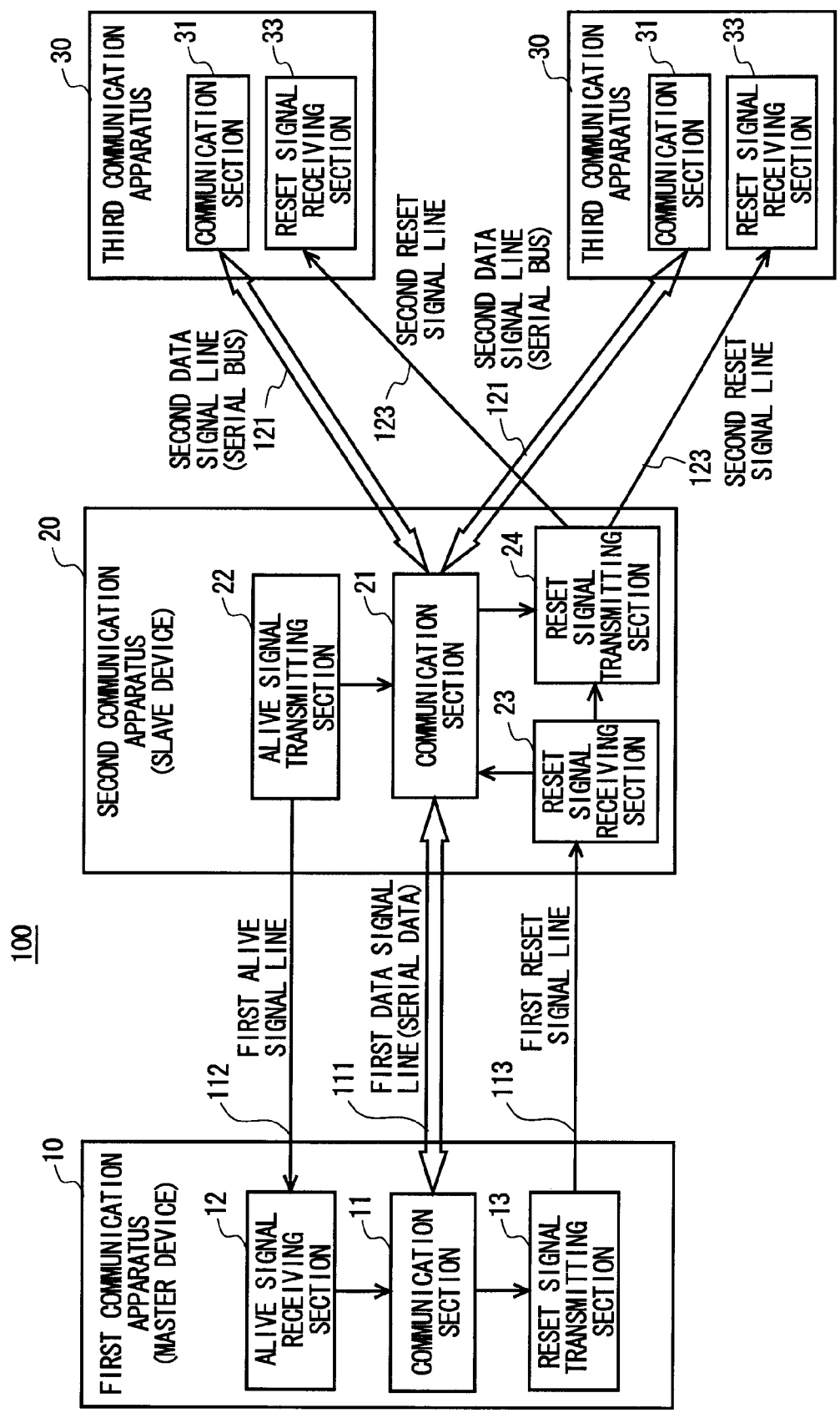
FIG. 6 shows a configuration of a communication system 100 according to a second modification of the present embodiment.

FIG. 6 shows a configuration of a communication system 100 according to a second modification of the present embodiment. The communication system 100 of the present modification adopts the same function and configuration as the communication system 100 shown in FIG. 5, and therefore components having the same function and configuration as those of the communication system 100 shown in FIG. 5 are given the same reference numerals and the following description includes only differing points.

A plurality of second data signal lines 121 and second reset signal lines 123 provide connections between the second communication apparatus 20 and a plurality of third communication apparatuses 30. Each second data signal line 121 corresponds to a third communication apparatus 30. Each second data signal line 121 transmits serial data of electric signals exchanged between the second communication apparatus 20 and the corresponding third communication apparatus 30.

Each second reset signal line 123 corresponds to a third communication apparatus 30. Each second reset signal line 123 transmits a reset signal instructing a reset, from the second communication apparatus 20 to the corresponding third communication apparatus 30. In the present example, each second reset signal line 123 transmits a reset signal that uses a voltage level to indicate whether a reset is instructed for the corresponding third communication apparatus 30.

In the present modification, the second communication apparatus 20 further includes a reset signal transmitting section 24. Furthermore, in the present modification, each third communication apparatus 30 includes a communicating section 31 and a reset signal receiving section 33.

The communicating section 21 of the second communication apparatus 20 communicates with each of the third communication apparatuses 30 via the second data signal lines 121. The reset signal transmitting section 24 of the second communication apparatus 20 transmits reset signals to the third communication apparatuses 30 via the second reset signal lines 123.

The communicating section 31 of each third communication apparatus 30 communicates with the second communication apparatus 20 via the corresponding second data signal line 121. The reset signal receiving section 33 of each third communication apparatus 30 receives a reset signal from the second communication apparatus 20 via the corresponding second reset signal line 123. Upon receiving the reset signal from the second communication apparatus 20 via the corresponding second reset signal line 123, the reset signal receiving section 33 of each third communication apparatus 30 resets the communicating section 31 of the third communication apparatus 30.

Upon receiving a reset signal from the second communication apparatus 20 via the first reset signal line 113, the reset signal receiving section 23 of the second communication apparatus 20 resets the communicating section 21 of the second communication apparatus 20 and provides the reset signal transmitting section 24 with instructions to transmit a reset signal. Upon receiving the instructions to transmit a reset signal from the reset signal receiving section 23, the reset signal transmitting section 24 of the second communication apparatus 20 sends a reset signal to each of the third communication apparatuses 30 via the second reset signal lines 123. As a result, when an emergency occurs, the second communication apparatus 20 can reliably reset all of the third communication apparatuses 30.

In the communication system 100 according to the present modification, the communicating section 21 of the second communication apparatus 20 transmits reset signals via the second reset signal line 123 to third communication apparatuses 30 corresponding to apparatus identification information included in the reset request received via the first data signal line 111. As a result, during normal operation, the second communication apparatus 20 reset, from among the plurality of third communication apparatuses 30, only the third communication apparatuses 30 designated by the reset request from the first communication apparatus 10.

Figure 7:
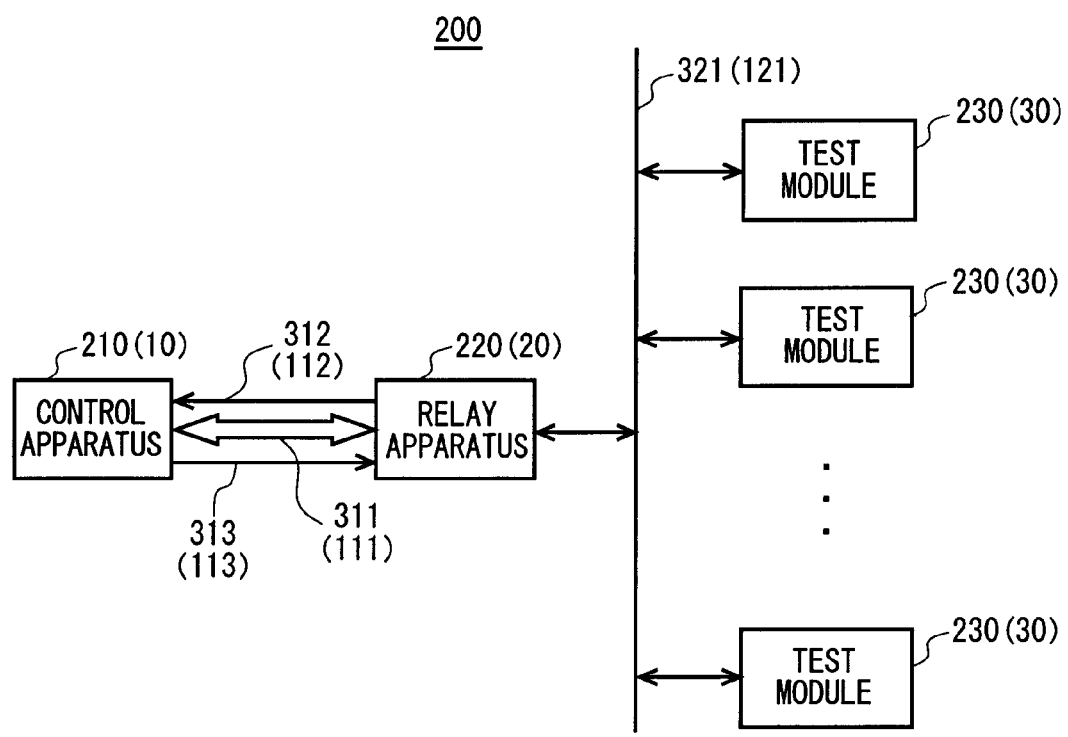
FIG. 7 shows a configuration of a test apparatus 200 according to an embodiment of the present invention.

FIG. 7 shows a configuration of a test apparatus 200 according to an embodiment of the present invention. The test apparatus 200 tests a device under test such as a semiconductor device. The test apparatus 200 includes one or more test modules 230, a control apparatus 210, and a relay apparatus 220.

Each test module 230 sends and receives signals to and from the device under test. For example, each test module 230 may supply the device under test with a test signal having a waveform corresponding to a test pattern, and judge acceptability of the device under test by comparing a response signal from the device under test to a logic value corresponding to an expected value pattern. Each test module 230 may be a board arranged in a test head.

The control apparatus 210 accesses each of the one or more test modules 230 to control the test modules 230. The control apparatus 210 may be realized by a computer that functions as the control apparatus 210 by executing a program.

The relay apparatus 220 relays access requests between the control apparatus 210 and the test module 230. The relay apparatus 220 may be a switch board arranged in a test head. Instead, the relay apparatus 220 may be a communication interface in each of the test modules 230.

The connection between the relay apparatus 220 and the control apparatus 210 may be achieved by, for example, a serial transmission cable 311 having a length of several meters and transmitting serial data, and an alive cable 312 and reset cable 313 that are provided in parallel with the serial transmission cable 311. A parallel bus 321 that transmits parallel data connects the relay apparatus 220 to each of the test modules 230.

A plurality of test apparatuses 200 may be connected in stages. In the test apparatus 200, the test modules 230 may be directly connected to the control apparatus 210.

In a test apparatus 200 configured in this way, the control apparatus 210 has the functions of the first communication apparatus 10 described above, the relay apparatus 220 has the functions of the second communication apparatus 20, and the test modules 230 have the functions of the third communication apparatuses 30.

Furthermore, the serial transmission cable 311 has the functions of the first data signal line 111. The alive cable 312 has the functions of the first alive signal line 112. The reset cable 313 has the functions of the first reset signal line 113. The parallel bus 321 has the function of the second data signal line 121 shown in FIG. 5.

As a result, in the test apparatus 200, the control apparatus 210 can easily detect activation of the relay apparatus 220. Also with this test apparatus 200, even when an error occurs in the data communication via the serial transmission cable 311, the control apparatus 210 can easily reset the relay apparatus 220 and each of the test modules 230.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A communication system comprising a first communication apparatus, a second communication apparatus, and a plurality of third communication apparatuses that communicate with the second communication apparatus, wherein
the first communication apparatus includes:
a communicating section that communicates with the second communication apparatus via a first data signal line;
an alive signal receiving section that receives, via a first alive signal line, an alive signal indicating whether the second communication apparatus is in an alive state in which it is capable of communicating with the first communication apparatus; and
a reset signal transmitting section that, when the second communication apparatus is not in the alive state, transmits a reset signal to the second communication apparatus,
the second communication apparatus includes:
a communicating section that communicates with the first communication apparatus via the first data signal line;
an alive signal transmitting section that transmits the alive signal via the first alive signal line; and
a reset signal receiving section that, upon receiving a reset signal, resets the communicating section of the second communication apparatus,
the communicating section of the first communication apparatus transmits to the second communication apparatus, via the first data signal line, a reset request that includes apparatus identification information identifying which third communication apparatuses are to be reset from among the plurality of third communication apparatuses, and
the communicating section of the second communication apparatus resets the third communication apparatuses corresponding to the apparatus identification information included in the reset request received via the first data signal line.

2. The communication system according to claim 1, wherein
when the second communication apparatus is not in the alive state, the reset signal transmitting section of the first communication apparatus transmits the reset signal to the second communication apparatus via a first reset signal line, and
upon receiving the reset signal via the first reset signal line, the reset signal receiving section of the second communication apparatus resets the communicating section of the second communication apparatus.

3. The communication system according to claim 1, wherein
the first data signal line has a lower attenuation rate than the first alive signal line at a cycle frequency of a data signal.

4. The communication system according to claim 1, wherein
when the second communication apparatus is in the alive state, the communicating section of the first communication apparatus transmits to the second communication apparatus, via the first data signal line, a reset request that instructs a reset for at least a portion of circuits in the second communication apparatus, and upon receiving the reset request via the first data signal line, the communicating section of the second communication apparatus resets the circuits to be reset in the second communication apparatus.

5. The communication system according to claim 4, wherein when the second communication apparatus is in the alive state, the communicating section of the first communication apparatus transmits to the second communication apparatus, via the first data signal line, a reset request that includes circuit identification information identifying circuits to be reset, and the communicating section of the second communication apparatus resets the circuits corresponding to the circuit identification information included in the reset request received via the first data signal line.

6. The communication system according to claim 1, wherein the communicating section of the second communication apparatus communicates with each of the third communication apparatuses via a plurality of second data signal lines, the second communication apparatus further includes a reset signal transmitting section that transmits a reset signal to each of the third communication apparatuses via a plurality of second reset signal lines, each third communication apparatus includes:
 a communicating section that communicates with the second communication apparatus via a second data signal line; and
 a reset signal receiving section that, upon receiving a reset signal via a second reset signal line, resets the communicating section of the third communication apparatus, and the communicating section of the second communication apparatus transmits a reset signal, via the second reset signal lines, to the third communication apparatuses corresponding to the apparatus identification information included in the reset request received via the first data signal line.

7. A test apparatus that tests a device under test, comprising:
 a plurality of test modules that tests the device under test;
 a control apparatus that controls testing of the device under test by the plurality of test modules; and
 a relay apparatus that relays communication between the control apparatus and the plurality of test modules, wherein
 the control apparatus includes:
  a communicating section that communicates with the relay apparatus via a first data signal line;
  an alive signal receiving section that receives, via, a first alive signal line, an alive signal indicating whether the relay apparatus is in an alive state in which it is capable of communicating with the control apparatus; and
  a reset signal transmitting section that, when the relay apparatus is not in the alive state, transmits a reset signal to the relay apparatus,
 the relay apparatus includes:
  a communicating section that communicates with the control apparatus via the first data signal line;
  an alive signal transmitting section that transmits the alive signal via the first alive signal line; and
  a reset signal receiving section that, upon receiving a reset signal, resets the communicating section of the relay apparatus, the communicating section of the control apparatus transmits to the relay apparatus, via the first data signal line, a reset request that includes module identification information identifying which test modules are to be reset from among the plurality of test modules, and the communicating section of the relay apparatus resets the test modules corresponding to the module identification information included, in the reset request received via the first data signal line.

8. The test apparatus according to claim 7, wherein when the relay apparatus is not in the alive state, the reset signal transmitting section of the control apparatus transmits the reset signal to the relay apparatus via a first reset signal line, and upon receiving the reset signal via the first reset signal line, the reset signal receiving section of the relay apparatus resets the communicating section of the relay apparatus.

9. A communication method used by a communication system including a first communication apparatus, a second communication apparatus, and a plurality of third communication apparatuses that communicate with the second communication apparatus comprising:

communicating between a communicating section of the first communication apparatus and a communicating section of the second communication apparatus via a first data signal line;

transmitting by an alive signal transmitting section of the second communication apparatus via a first alive signal line, an alive signal indicating whether the second communication apparatus is in an alive state in which it is capable of communicating with the first communication apparatus;

receiving by an alive signal receiving section of the first communication apparatus the alive signal via the first alive signal line;

transmitting, by a reset signal transmitting section of the first communication apparatus, a reset signal to the second communication apparatus, when the second communication apparatus is not in the alive state;

resetting, by a reset signal receiving section of the second communication apparatus, the communicating section of the second communication apparatus, when the reset signal is received;

transmitting, by the communicating section of the first communication apparatus to the second communication apparatus via the first data signal line, a reset request that includes apparatus identification information identifying which third communication apparatuses are to be reset from among the plurality of third communication apparatuses; and resetting, by the communicating section of the second communication apparatus, the third communication apparatuses corresponding to the apparatus identification information included in the reset request received via the first data signal line.

10. A test method used by a test apparatus to test a device under test comprising:
 testing, by the plurality of test modules, the device under test;
 controlling testing, by a control apparatus, of the device under test by the plurality of test modules;
 relaying, by a relay apparatus, communication between the control apparatus and the plurality of test modules;
 communicating, between a communicating section of the control apparatus and a communicating section of the relay apparatus, via a first data signal line;

transmitting, by an alive signal transmitting section of the relay apparatus via a first alive signal line, an alive signal indicating whether the relay apparatus is in an alive state in which it is capable of communicating with the control apparatus;

receiving, by an alive signal receiving section of the control apparatus, the alive signal via the first alive signal line;

transmitting, by a reset signal transmitting section of the control apparatus, a reset signal to the relay apparatus, when the relay apparatus is not in the alive state;

resetting, by a reset signal receiving section of the relay apparatus, the communicating section of the relay apparatus, when the reset signal is received;

transmitting, from the communicating section of the control apparatus to the relay apparatus via the first data signal line, a reset request that includes module identification information identifying which test modules are to be reset from among the plurality of test modules; and resetting, by the communicating section of the relay apparatus, the test modules corresponding to the module identification information included in the reset request received via the first data signal line.

* * * * *